US006165374A

United States Patent [19]

Cathey et al.

[11] Patent Number: 6,165,374
[45] Date of Patent: *Dec. 26, 2000

[54] METHOD OF FORMING AN ARRAY OF EMITTER TIPS

[75] Inventors: David A. Cathey; Kevin Tjaden, both of Boise, Id.

[73] Assignee: Micron Technology, Inc., Boise, Id.

[ * ] Notice: This patent is subject to a terminal disclaimer.

[21] Appl. No.: 09/354,529

[22] Filed: Jul. 15, 1999

Related U.S. Application Data

[62] Division of application No. 09/024,877, Feb. 17, 1998, which is a continuation of application No. 08/665,620, Jun. 18, 1996, Pat. No. 5,753,130, which is a continuation of application No. 08/338,705, Nov. 14, 1994, abandoned, which is a continuation-in-part of application No. 08/184,819, Jan. 21, 1994, Pat. No. 5,391,259, which is a continuation-in-part of application No. 07/883,074, May 15, 1992, Pat. No. 5,302,238.

[51] Int. Cl.[7] .............................. B44C 1/22; H01L 21/00
[52] U.S. Cl. .............................................. 216/11; 216/42
[58] Field of Search .................................. 216/11, 42, 48

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 3,814,968 | 6/1974 | Nathanson et al. | 313/95 |
| 4,407,695 | 10/1983 | Deckman et al. | 216/42 |
| 4,513,308 | 4/1985 | Greene et al. | 357/55 |
| 4,566,935 | 1/1986 | Hornbeck | 15/626 |
| 4,685,996 | 8/1987 | Busta et al. | 156/628 |
| 4,766,340 | 8/1988 | Van der Mast et al. | 313/366 |
| 4,806,202 | 2/1989 | Tang et al. | 156/657 |
| 4,940,916 | 7/1990 | Borel et al. | 313/306 |
| 4,968,382 | 11/1990 | Jacobson et al. | 156/643 |
| 4,992,699 | 2/1991 | McClure et al. | 156/647 X |
| 5,064,396 | 11/1991 | Spindt | 445/50 |
| 5,083,958 | 1/1992 | Longo et al. | 156/644 X |
| 5,186,670 | 2/1993 | Doan et al. | 445/24 |
| 5,201,992 | 4/1993 | Marcus et al. | 156/643 |
| 5,220,725 | 6/1993 | Chan et al. | 156/657 X |
| 5,221,221 | 6/1993 | Okaniwa | 156/657 X |
| 5,228,877 | 7/1993 | Allaway et al. | 156/659.1 X |
| 5,229,331 | 7/1993 | Doan et al. | 437/228 |

(List continued on next page.)

FOREIGN PATENT DOCUMENTS

| | | |
|---|---|---|
| 0379298A2 | 7/1990 | European Pat. Off. . |
| 4232886A1 | 4/1993 | Germany . |

OTHER PUBLICATIONS

Marcus et al., "Formation of Silicon Tips with 1 nm Radius", Appl. Physics Letter, vol. 56, No. 3, Jan. 15, 1990.

Hunt et al., "Structure and Electronical Characteristics of Silicon Field Emmission Microelectric Devices", IEEE Transaction on Electron Devices, vol. 38, No. 10, Oct. 1991.

McGruer et al., "Oxidation–Sharpened Gated Field Emitter Array Process", IEEE Transactions On Electron Devices, vol. 38, No. 10, Oct. 1991.

Keiichi Betsui "Fabrication and Characteristics of Si Field Emitter Arrays" 1991, Fujitsu Laboratories, pp. 26–29.

R.Z. Bakhtizin, S.S. Ghots, and E.K. Ratnikova, "GaAs Field Emitter Arrays", *IEEE Transactions On Electron Devices*, vol. # 8, No. 10, Oct. 1991, pp. 2398–2400.

R.N. Thomas, R.A. Wickstrom, D.K. Schrodcer, and H.C. Nathanson, "Fabrication and Some Applications of Large–Area Silicon Field Emission Arrays", *Solid–State Electronics*, vol. 17, 1974, pp. 155–163.

*Primary Examiner*—Randy Gulakowski
*Assistant Examiner*—Shamim Ahmed

[57] ABSTRACT

A method for fabricating sharp asperities. A substrate is provided which has a mask layer disposed thereon, and a layer of micro-spheres is disposed superjacent the mask layer. The micro-spheres are for patterning the mask layer. Portions of the mask layer are selectively removed, thereby forming circular masks. The substrate is isotropically etched, thereby creating sharp asperities.

17 Claims, 5 Drawing Sheets

U.S. PATENT DOCUMENTS

| | | | |
|---|---|---|---|
| 5,266,530 | 11/1993 | Bagley et al. | 156/651 X |
| 5,267,884 | 12/1993 | Hosogi | 445/24 |
| 5,275,693 | 1/1994 | Nakama | 216/42 |
| 5,277,638 | 1/1994 | Lee | 445/24 |
| 5,312,514 | 5/1994 | Kumar | 216/42 |
| 5,399,238 | 3/1995 | Kumar | 216/11 |
| 5,510,156 | 4/1996 | Zhao | 427/534 |

METHOD OF FORMING AN ARRAY OF EMITTER TIPS

This is a divisional application of U.S. application Ser. No. 09/024,877, filed on Feb. 17, 1998, which is a continuation application of U.S. application Ser. No. 08/665,620, filed on Jun. 18, 1996, now U.S. Pat. No. 5,753,130, which is a continuation of Ser. No. 08/338,705, filed Nov. 14, 1994, abandoned, which is a continuation-in-part of U.S. application Ser. No. 08/184,819, filed on Jan. 21, 1994, now U.S. Pat. No. 5,391,259, which is a continuation-in-part of U.S. application Ser. No. 07/883,074, filed on May 15, 1992, now U.S. Pat. No. 5,302,238, issued Apr. 12, 1994.

CROSS-REFERENCE TO RELATED APPLICATIONS

The present application is related to U.S. Pat. No. 5,302,239, issued on Apr. 12, 1994, entitled, "Method of making Atomically Sharp Tips useful in Scanning Probe Microscopes," assigned to Micron Technology, Inc., and having a common inventor with the present application.

FIELD OF THE INVENTION

This invention relates to display technology, and more particularly to the fabrication of an array of atomically sharp field emission tips.

BACKGROUND OF THE INVENTION

The clarity, or resolution, of a field emission display is a function of a number of factors, including emitter tip sharpness. The process of the present invention is directed toward the fabrication of very sharp cathode emitter tips.

A great deal of work has been done in the area of cold cathode tip formation. See, for example, the "Spindt" patents, U.S. Pat. Nos. 3,665,241, and 3,755,704, and 3,812,559 and 5,064,396. See also, U.S. Pat. No. 4,766,340 entitled, "Semiconductor Device having a Cold Cathode," and U.S. Pat. No. 4,940,916 entitled, "Electron Source with Micropoint Emissive Cathodes and Display Means by Cathodeluminescence Excited by Field Emission Using Said Source."

One current approach toward the creation of an array of emitter tips, is to use a mask and to etch silicon to form a tip structure, but not to completely form the tip. Prior to completing a sharp point, the etching process is discontinued. The idea is to catch the etch at a stage before the mask is dislodged from the apex of the tip. See, for example, U.S. Pat. No. 5,201,992 to Marcus et al., entitled, "Method for Making Tapered Microminiature Silicon Structures."

Prior art teaches that it is necessary to terminate the etch at or before the mask is fully undercut to prevent the mask from being dislodged from the apex. If an etch proceeds under such circumstances, the tips become lop-sided and uneven due to the presence of the mask material along the side of the tip, or the substrate during a dry etch and additionally, the apex may be degraded, as seen in FIG. 8. Such a condition also leads to contamination problems because of the mask material randomly lying about a substrate, which will mask off regions where no masking is desirable, and continued etching will yield randomly placed, undesired structures in the material being etched.

If the etch is continued, after the mask is removed, the tip may become more dull. This results because the etch chemicals will remove material in all directions, thereby attacking the exposed apex of the tip while etching the sides. In addition, the apex of the tip may be degraded when the mask has been dislodged due to physical ion bombardment during a dry etch.

Hence, the tendency is to underetch (i.e, stop the etch process before a fine point is formed at the apex of the tip) the tip, thereby creating a structure referred to as a "flat top." Then, an oxidation step is typically performed to sharpen the tip. This method results in a non-uniform etch results across the array, and the tips will have different heights and shapes.

Others have tried to manufacture tips by etching, but they do not undercut the mask all the way as in the process of the present invention, and furthermore do not continue etching beyond full undercut of the mask without suffering degradation to the tip as in the process of the present invention, which allows for latitude which is required for manufacturing. Rather they remove the mask before the tip is completely undercut, and sharpen the tips from there. The wet silicon etch methods of the prior art, result in the mask being dislodged from the apex of the tip, at the point of full undercut which can contaminate the etch bath, generate false masking, and degrade the apex.

The non-uniformity among the tips may also present difficulties in subsequent manufacturing steps used in the formation of the display, especially those processes employing chemical mechanical planarization. See for example, U.S. Pat. No. 5,229,331, entitled, "Method to Form Self-Aligned Gate Structures Around Cold Cathode Emitter Tips Using Chemical Mechanical Polishing Technology," and U.S. Pat. No. 5,186,670, entitled, "Method to Form Self-Aligned Gate and Focus Rings," also assigned to Micron Technology, Inc. Non-uniformity is particularly troublesome if it is abrupt, as opposed to a gradual change across the wafer.

Fabrication of a uniform array of tips using current processes is very difficult to accomplish in a manufacturing environment for a number of reasons. For example, simple etch variability across a wafer will effect the time at which the etch should be terminated with the prior art approach.

Generally, it is difficult to attain plasma tip etches with uniformities better than 5%, with uniformities of 10%–20% being more common. This makes the "flat top" of an emitter tip etched using conventional methods vary in size. In addition, the oxidation necessary to "sharpen" or point the tip varies by as much as 20%, thereby increasing the possibility of non-uniformity among the various tips of an array.

Tip height and other critical dimensions suffer from the same effects on uniformity. Variations in the masking uniformity, and material to be etched compound the problems of etch uniformity.

Manufacturing environments require processes that produce substantially uniform and stable results. In the manufacture of an array of emitter tips, the tips should be of uniform height, aspect ratio, sharpness, and general shape, with minimum deviation, particularly in the uppermost portion.

SUMMARY OF THE INVENTION

The process of the present invention employs dry etching (also referred to as plasma etching) to fabricate sharp emitter tips. Plasma etching is the selective removal of material through the use of etching gases. It is a chemical process which uses plasma energy to drive the reaction. Those factors which control the precision of the etch include the temperature of the substrate, the time of immersion, the composition of the gaseous etchant, pressure, applied RF power, and etch hardware configuration.

The mask layer is formed such that it exposes the silicon substrate, which silicon substrate is then etched to form the sharp emitter tips.

The process of the present invention can be used to produce sharp tips with relatively any given aspect ratio and height with a single step (in situ) or multi-step plasma dry etch process.

The present invention, under some conditions provides a very large manufacturing window, particularly when the tips are etched into a layer or substrate in which the thickness of the layer is not totally consumed during the tip etch in unmasked (i.e., non-tip) regions.

In the preferred embodiment, a dry etch proceeds for about 2.3 minutes to undercut the mask and form a sharp tip. An overetch can continue the process without a substantial change in the appearance of the tips. The shape of the tip is self-repeating because the mask has been optimized to remain in place relative to the top of the emissive structure region being formed. The tip is etched vertically, as well as horizontally, and the shapes are most uniform in appearance when the rate of horizontal etching is within a factor of four to the vertical, with the most uniform results occurring after a 2:1 ratio of vertical to horizontal etching rate.

Contrary to the current teaching, the present invention involves dry etching the apex of the tip to a complete point, and continuing etching to add the requirement of process margin required in manufacturing, such that the mask appears as a see-saw or teeter-totter at equilibrium, essentially perfectly balanced on the apex of the tip.

In the preferred embodiment, a substrate of 14–21 ohms-cms P-type 1-0-0 single crystal silicon is the material from which the tips are formed. The mask in the preferred embodiment has a circular shape, and is comprised of 0.1 μm thick thermal silicon dioxide with a diameter of 1 μm. Contrary to prior art teachings, the mask can be comprised of dimensions, and material selection, such that a particular etch process of a particular material may be employed with that mask, and the mask will adhere to the tip and can be overetched, beyond full undercut without adversely effecting tip shape and uniformities.

This benefit is believed to be obtained as a result of the attractive forces between the mask and the tip, such as vander Waals, electrostatic, and electrochemical forces.

Experiments were undertaken with a variety of masks, having differing compositions and dimensions in combination with the etch conditions of the Table 1 below, and a tip material of 14–21 ohm-cm 100 p-type single crystal silicon. The mask formed from a layer of 1 μm. thick HPR 6512 photoresist (Hunt Photoresist), and 0.1 μm. thick thermal silicon dioxide stack, was found to be unsatisfactory for use in the present invention. It became dislodged from the tips during the etch process, resulting in malformed tips. This effect is believed to be influenced by the mass of the etch mask.

Other masks which were found to be unsatisfactory for use in the present invention include: a 0.4μm. oxide mask; and a 1 μm. mask comprised solely of HPR 6512 photoresist.

However, a mask comprising 0.1 μm. thick thermal oxide has displayed very good results in the present invention, as well as a mask of 0.051 μm. thick thermal oxide.

One advantage of the process of the present invention is that it enables the fabrication of tips having more uniform distribution of tip dimensions. Another advantage is that it enables the formation of a good distribution of extremely sharp points which may be enhanced by further processing, but are enabled functional with etching as a tip formation only. Yet still another advantage is that it provides a method for overetching with a dry etch without significantly degrading the desired tip shape.

One aspect of the process of the present invention involves a method for fabricating sharp asperities. A substrate is provided which has a mask layer disposed thereon, and a layer of beads or micro-spheres is disposed superjacent the mask layer. The beads or micro-spheres are for patterning the mask layer. The substrate is etched, thereby creating sharp asperities.

Another aspect of the process of the present invention involves a masking process useful in etching micro-tips. An oxide layer is formed superjacent a substrate. The oxide layer is patterned using synthetic beads, and then the oxide layer is etched.

Yet another aspect of the process of the present invention involves a patterning process useful for fabricating micro-tips. A first layer is formed superjacent a substrate, and a layer of beads or micro-spheres is placed upon the first layer. The first layer is etched, and the substrate is also etched, thereby fabricating micro-tips.

As one point becomes sharp, it continues to etch for a period of time, with the mask "following" the tip down as small amounts of material are removed from the very apex of the tip, as etching continues beyond full undercut of the mask. For this reason, once an emitter tip is etched to a point, its dimensions become fixed. All tips on a substrate continue to etch until they become sharp, at which point, they have substantially the same height, aspect ratio, and sharpness.

Oxidation of tips can be employed to provide sharper emitters with lower electric fields required to produce emission, the benefits of oxidation sharpening are more controlled and a more efficiently exploited with the tip etch of the present invention, since the tip geometry is maintained rather than altered.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 1:
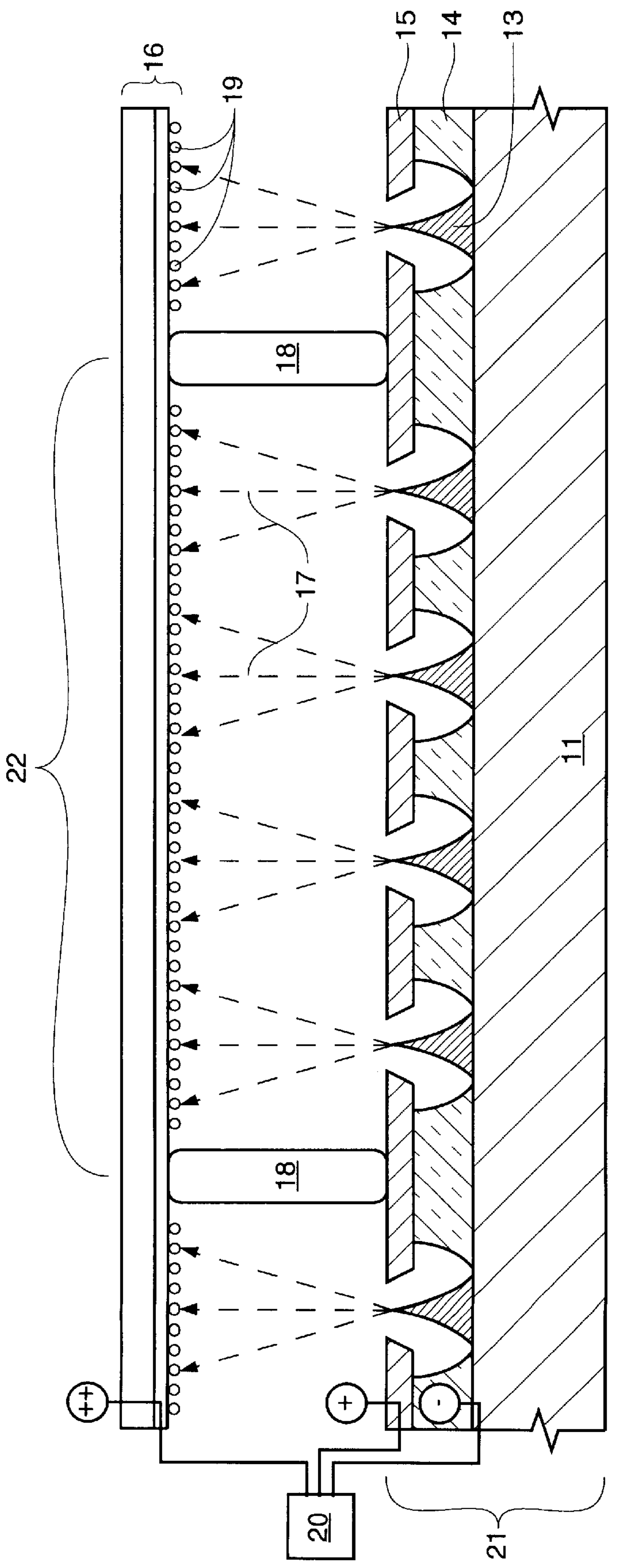
FIG. 1 is a cross-sectional schematic drawing of a pixel of a flat panel display having cathode emitter tips fabricated by the process of the present invention.

Referring to FIG. 1, a representative field emission display employing a display segment 22 is depicted. Each display segment 22 is capable of displaying a pixel of information, or a portion of a pixel, as, for example, one green dot of a red/green/blue full-color triad pixel. Preferably, a single crystal silicon layer serves as a substrate 1.

Alternatively, amorphous silicon deposited on an underlying substrate comprised largely of glass or other combination may be used as long as a material capable of conducting electrical current is present on the surface of a substrate so that it can be patterned and etched to form micro-cathodes 13.

At a field emission site, a micro-cathode 13 has been constructed on top of the substrate 11. The micro-cathode 13 is a protuberance which may have a variety of shapes, such as pyramidal, conical, or other geometry which has a fine micro-point for the emission of electrons. Surrounding the micro-cathode 13, is a grid structure 15. When a voltage differential, through source 20, is applied between the cathode 13 and the grid 15, a stream of electrons 17 is emitted toward a phosphor coated screen 16. Screen 16 is an anode.

The electron emission tip 13 is integral with substrate 11, and serves as a cathode. Gate 15 serves as a grid structure for applying an electrical field potential to its respective cathode 13.

A dielectric insulating layer 14 is deposited on the conductive cathode 13, which cathode 13 can be formed from the substrate or from one or more deposited conductive films, such as a chromium, amorphous silicon bilayer. The insulator 14 also has an opening at the field emission site location.

Disposed between said faceplate 16 and said baseplate 21 are located spacer support structures 18 which function to support the atmospheric pressure which exists on the electrode faceplate 16 as a result of the vacuum which is created between the baseplate 21 and faceplate 16 for the proper functioning of the emitter tips 13.

The baseplate 21 of the invention comprises a matrix addressable array of cold cathode emission structures 13, the substrate 11 on which the emission structures 13 are created, the insulating layer 14, and the anode grid 15.

In the process of the present invention, the mask 30 dimensions, the balancing of the gases, and parameters in the plasma etch will enable the manufacturer to determine, and thereby significantly control, the dimensions of the tip 13.

The composition and dimensions of the mask 30 effect the ability of the mask 30 to remain balanced at the apex of the emitter tip 13, and to remain centered on the apex of the tip 13 during the overetch of the tip 13. "Overetch" referring to the time period when the etch process is continued after a substantially full undercut is achieved. "Full undercut" refers to the point at which the lateral removal of material is equal to the original lateral dimension of the mask 30.

Figure 2:
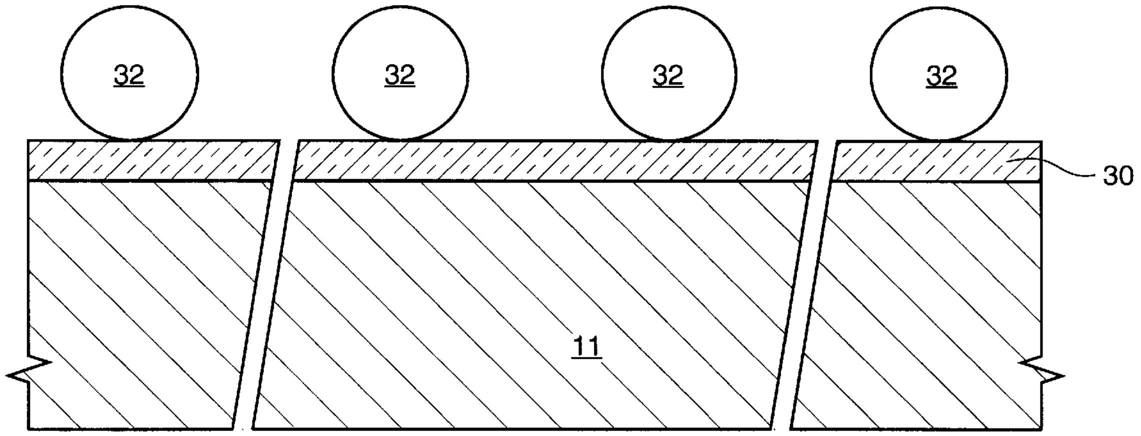
FIG. 2 is a cross-sectional schematic drawing of a substrate on which is disposed a mask layer upon which is a layer of micro-spheres, according to the process of the present invention.

FIG. 2 depicts the substrate 11, which substrate 11 is amorphous silicon overlying glass, polysilicon, or any other material from which the emitter tip 13 is fabricated. The discussion refers to tips 13, however sharp edges are also micro-machined by the process of the present invention. The sharp edges alternatively serve as emitters in field emission devices.

The present invention uses a substrate 11 which, in the preferred embodiment includes a single crystal silicon. However, a deposited material, such as polysilicon or amorphous silicon, or carbon or other metal or suitable substrate 11 material may also be used. Typically, these are semiconductor wafers, although it is possible to use other materials, such as silicon on sapphire (SOS). Therefore, "wafers" is intended to refer to the substrate 11 on which the inventive emitter tips 13 are formed.

The substrate 11 has a mask layer 30 deposited or grown thereon. In the process of the present invention, 0.1 $\mu$m of silicon dioxide 30 is formed on a wafer, and functions as the mask layer 30. Tip geometries and dimensions, and conditions for the etch process will vary with the type of material used to form the tips 13, since the specific electrochemical, electrostatic, vander Waals, and interactive surface forces will vary with the material.

The mask layer 30 is made of any suitable material such that its thickness is great enough to avoid being completely consumed during the etching process, yet not so thick as to overcome the adherent forces which maintain it in the correct position with respect to the tip 13 throughout the etch process.

A photoresist layer 32 or other protective element is patterned on the mask layer 30, if the desired masking material cannot be directly patterned or applied. In the case in which the photoresist layer 32 is patterned, the most preferred shapes are dots or circles.

In the process of the present invention, the protective element 32 is a layer of micro-spheres or beads 32. The beads 32 are generally comprised of a latex or other polymer material. However the beads 32 can comprise a variety of organic and inorganic materials. Such beads are available from Interfacial Dynamics Corporation, Portland Oreg. or Bangs Laboratories, Inc., Carmel, Ind. The beads 32 are relatively uniform, and have a diameter of 1.05 $\mu$m±2%. The range of bead 32 sizes is 0.01 $\mu$m–10 $\mu$m.

The diameter of the beads 32 corresponds to the diameter of its respective oxide mask 30. The beads 32 act as a protective element during the etching of the mask layer 30. Hence, the beads 32 eliminate the need for a high resolution photolithography step. This represents a tremendous manufacturing improvement, as the photolithography step is often the limiting step in processing.

It is contemplated that future embodiments will comprise the use of photoresist 32 as the mask 30 itself, having optimized properties and dimensions which will enable the mask 32 to remain balanced at the tip 13 apex after full undercut is achieved.

Figure 3:
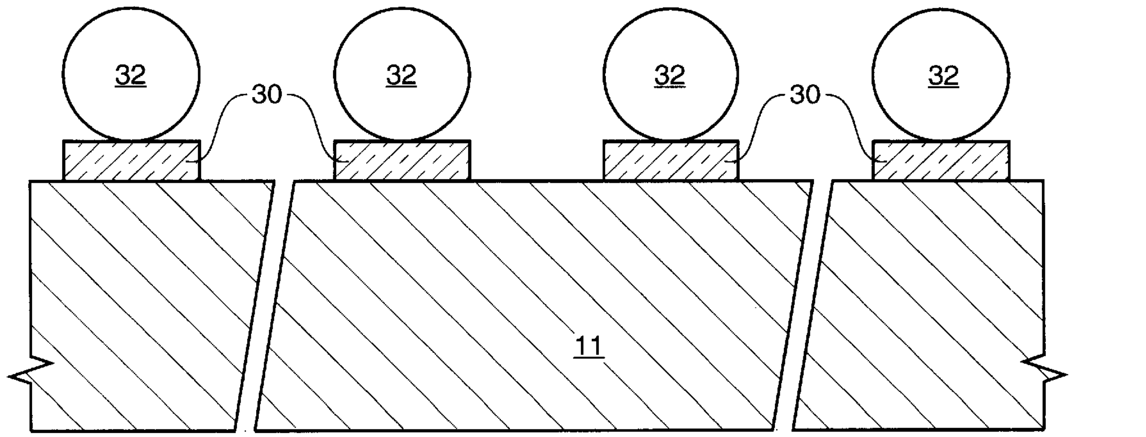
FIG. 3 is a cross-sectional schematic drawing of the structure of FIG. 2, after the mask layer has been etched to form the masks for the tips, according to the process of the present invention.

The next step in the illustrative process of the present invention is the selective removal of those portions of the mask layer 30 which are not covered by the protective beads 32 (FIG. 3). The selective removal of the mask layer 30 is accomplished through a dry plasma etch.

In a plasma etch method, the typical etchants used to etch silicon dioxide include, but are not limited to: chlorine and fluorine, and typical gas compounds include: $CF_4$, $CHF_3$, $C_2F_6$, and $C_3F_8$. Fluorine with oxygen can also be used to accomplish the oxide mask 30 etch step. In our experiments $CF_4$, $CHF_3$, and argon were used. The etchant gases are selective with respect to silicon, and the etch rate of oxide is known in the art, so the endpoint of the etch step can be calculated.

After the mask pads 30 have been formed, in the preferred embodiment, the latex beads 32 are allowed to remain in position. Alternatively, the beads 32 are removed. FIG. 3 depicts the masked 30 structure prior to the silicon etch step in which the tips 13 are formed.

Each spherical bead 32 is disposed superjacent its respective mask pad 30, and represents the location of a tip 13. The diameter of the bead 32' roughly corresponds to the width of the mask pad 30'. Since the beads are substantially alike in size, the resulting masks 30, and likewise the tips 13, are circular uniform in size. The beads 32 are preferably spherical in shape, therefore the mask pad 30 is circular. The tip 13 is located at the center of the mask pad 30, and in line with the center of the micro-sphere 32, thereby enhancing mechanical stability.

A plasma etch, with selectivity to the etch mask 30, is employed to form the tips 13, preferably, in the case of silicon a plasma containing a fluorinated gas, such as $SF_6$, $NF_3$, or $CF_4$, in combination with a chlorinated gas, such as HCl or $Cl_2$. Most preferably the plasma comprises a combination of $SF_6$ and $Cl_2$, having an additive, such as helium.

The etch chemistries are also selective to the latex beads 32. Therefore, the beads 32 remain in place during the formation of the tips 13.

Figure 4:
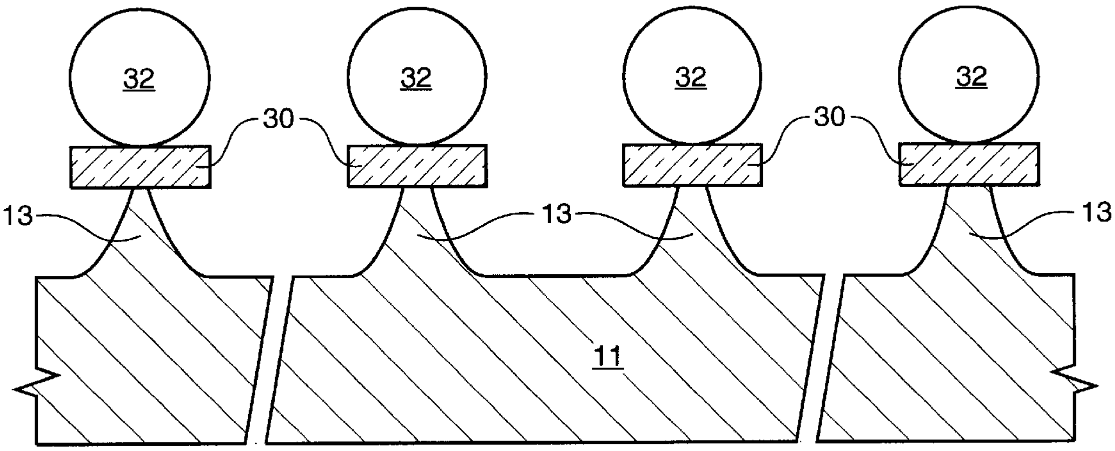
FIG. 4 is a cross-sectional schematic drawing of the structure of FIG. 3, during the etch process of the present invention.
Figure 5:
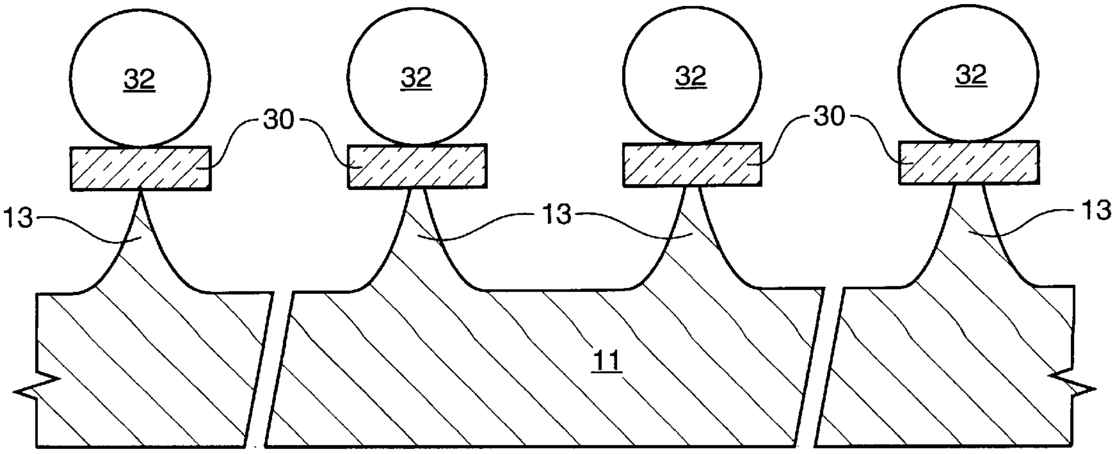
FIG. 5 is a cross-sectional schematic drawing of the structure of FIG. 4, as the etch proceeds according to the process of the present invention, illustrating that some of the tips become sharp before other tips.
Figure 6:
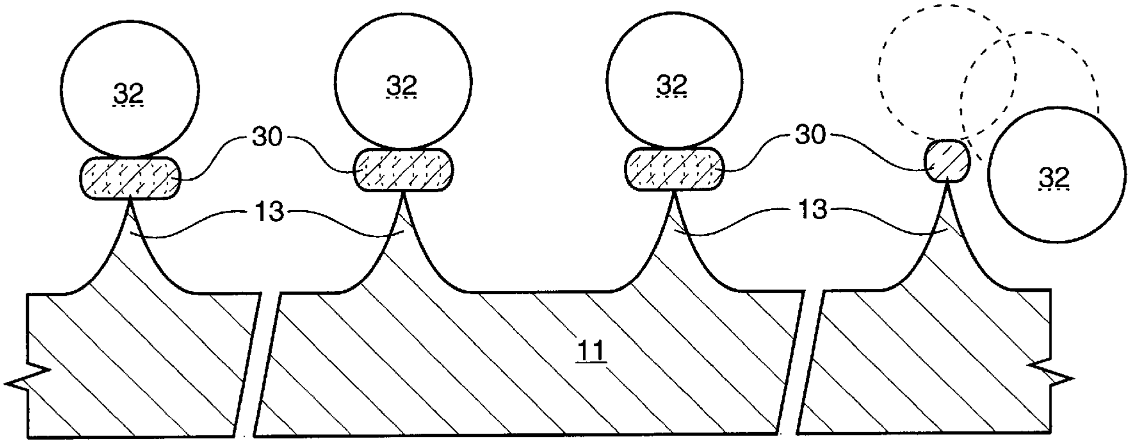
FIG. 6 is a cross-sectional schematic drawing of the structure of FIG. 5, depicting the removal of the masks and the micro-spheres, according to the process of the present invention.

The etch continues until substantially all of the tips 13 on the wafer have completely undercut their respective mask 30, as shown in FIGS. 4–6. It is believed that vander Waals forces, electrostatic, electrochemical attraction, and/or attractive surface forces have a role in securing the mask 30 in place during continued etching.

Experiments were conducted on a Lam 490 etcher with enhanced cooling. The lower electrode was maintained substantially in the range of 21° C. However, it is anticipated that a Lam 480 or 490 etcher without enhanced cooling would also work within the specified ranges.

The primary means of controlling the height to width ratio of the tip 13 formed by the process of the present invention is through the combination of feed gases, power, and pressure during the plasma etching of the tips 13.

The following are the ranges of parameters for the process described in the present application. Included in Table 1, is a range of values investigated during the characterization of the process as well as a range of values which provided the best results for tips 13 that were from 0.70 $\mu$m to 1.75 $\mu$m high and 1 $\mu$m to 1.5$\mu$m at the base. One having ordinary skill in the art will realize that the values can be varied to obtain tips 13 having other height and width dimensions.

TABLE 1

| PARAMETER | INVESTIGATED RANGE | PREFERRED RANGE |
|---|---|---|
| $Cl_2$ | 9–20 SCCM | 8–12 SCCM |
| $SF_6$ | 5–55 SCCM | 45–55 SCCM |
| He | 35–65 SCCM | 40–60 SCCM |
| $O_2$ | 0–20 SCCM | 0 SCCM |
| POWER | 50–250 W | 100–200 W |
| PRESSURE | 100–800 MTORR | 300–500 MTORR |
| ELECTRODE SPACING | 1.0–2.5 CM | 1.8–2.0 CM |
| TIME | 1–5.5 MIN | 2–3 MIN |

The ability to continue the etch to its conclusion (i.e., past full undercut) with minimal changes to the functional shape between the first tip 13 to become sharp and the last tip 13 to become sharp, provides a process in which all of the tips 13 in an array are essentially identical in characteristics. Tips 13 of uniform height and sharpness are accomplished by the careful selection of mask 30 material, size, and thickness. See, for example, FIGS. 4–5.

After the array of emitter tip 13 has been fabricated, and the desired dimensions have been achieved, the oxide mask 30 is removed, as depicted in FIG. 6. The mask 30 is stripped by any of the methods well known in the art, for example, a wet etch using a hydrofluoric acid (HF) solution or other HF containing mixture. Such an etch is commonly referred to as a buffered oxide etch (B.O.E.), which is well-known in the art of oxide etching.

Figure 7:
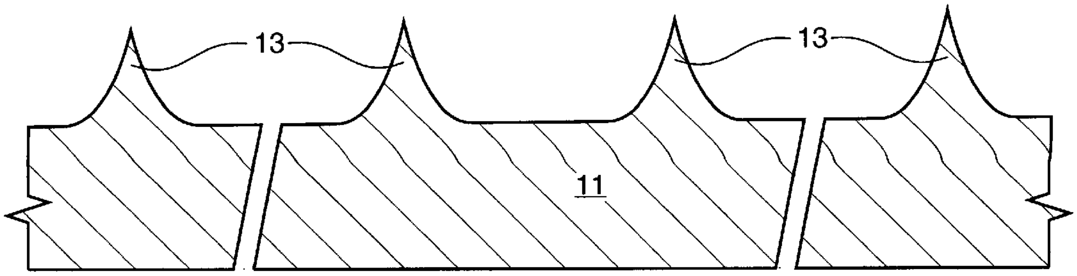
FIG. 7 is a cross-sectional schematic drawing of the structure of FIG. 6, depicting the sharp cathode tip after the etch has been completed, and the mask layer has been removed.
Figure 8:
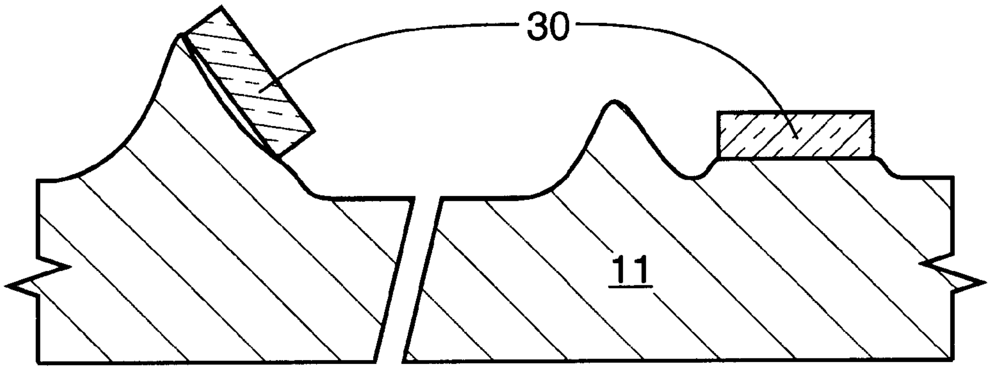
FIG. 8 is a cross-sectional schematic drawing of the malformed structure which would result if the mask layer is dislodged from the tips during the etch.

The dotted lines in the mask pads 30 indicate that the mask pads 30 are etched away. When the mask pads 30 become very small or are eliminated, the micro-spheres 32 are dislodged from their respective positions. When the masks 30 have been cleared, the etchant, micro-spheres 32, and material from the masks 30 are removed from the etch chamber. FIG. 7 depicts the substantially uniform array of emitter tips 13 formed by the process of the present invention.

All of the U.S. patents and patent applications cited herein are hereby incorporated by reference herein as if set forth in their entirety.

While the particular process for creating sharp emitter tips for use in flat panel displays as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

For example, the process of the present invention was discussed with regard to the fabrication of uniform arrays of sharp emitter tips for use in flat panel displays, however, one with ordinary skill in the art will realize that such a process can applied to other field ionizing and electron emitting structures, and to the micro-machining of structures in which it is desirable to have a sharp point, such as a probe tip, or a device.

What is claimed is:

1. A method of forming a plurality of emitter tips, comprising the steps of:

providing a substrate;

forming a patterned mask layer over said substrate, said patterned mask layer having an array of mask elements; and plasma etching said substrate to form an array of emitter tips, each of said emitter tips formed beneath a respective said mask element, said etching continued to over-etch each of said emitter tips with each said mask element remaining in contact with a respective emitter tip until said plasma etch is ended.

2. A method according to claim 1, wherein at least one of said mask elements comprises a circular shape.

3. A method according to claim 1, wherein said substrate comprises silicon and said step of forming the patterned mask layer comprises:

forming a layer of thermal oxide over said substrate, said thermal oxide formed with a thickness less than 0.4 $\mu$m; and patterning said thermal oxide layer into a plurality of circular shapes as said mask elements.

4. A method according to claim 3, wherein said thermal oxide is formed with a thickness in the range of 0.05 $\mu$m to 0.$\mu$m.

5. A method according to claim 3, wherein said step of patterning the thermal oxide layer comprises employing a first plasma to etch said thermal oxide preferentially to said substrate, said first plasma being different from that employed during said plasma etching of said substrate.

6. A method according to claim 5, wherein said substrate comprises single crystal silicon of a <100> orientation, and said plasma etching of said substrate provides a lateral etch rate of said substrate material within a factor of four of a vertical etch rate.

7. A method according to claim 1, wherein said mask elements are each provided a thickness and width enabling continued contact with respective developing apexes of substrate material therebelow during said step of plasma etching of said substrate.

8. A method according to claim 1, further comprising a step of removing said mask elements after said step of plasma etching said substrate.

9. A method of forming a plurality of emitter tips, comprising the steps of:

providing a substrate;

forming a patterned hard mask over said substrate comprising a plurality of discrete mask elements; and plasma etching said substrate substantially sufficient to remove substrate material laterally under each mask element, which lateral removal removes substrate material from beneath full widths of respective said mask elements, to define said emitter tips while leaving each mask element in contact with a respective emitter tip.

10. A method according to claim 9, wherein said hard mask comprises thermal oxide formed with a thickness in the range of 0.05 $\mu$m to 0.1 $\mu$m.

11. A method according to claim 10, wherein said plasma etching of said substrate provides a lateral etch rate of said substrate material within a factor of four of a vertical etch rate.

12. A method according to claim 11, wherein said substrate comprises single crystal silicon of a <100> orientation.

13. A method of defining emitter tips on a substrate, comprising:

providing said substrate;

defining a patterned mask over said substrate, said patterned mask providing mask material at locations over said substrate where emitter tips will be formed;

plasma etching said substrate and continuing said plasma etch to over-etch each emitter tip of said plurality of said emitter tips to form a sharp tip having an apex while maintaining said mask material over each said emitter tip; and after said over-etch is completed, removing said mask material from contact with each said emitter tip.

14. A method according to claim 13, wherein said substrate comprises silicon, said method further comprising:

forming a layer of oxide over said substrate; and etching said oxide layer to define said patterned mask and expose portions of silicon of said substrate.

15. A method according to claim 14, wherein said etching of said oxide layer comprises etching oxide preferentially with the silicon of said substrate providing an etch stop during said etching.

16. A method of forming emitter tips on a substrate, comprising the steps of:

providing a substrate;

a plurality of mask elements on said substrate;

etching said substrate to remove substrate material in a lateral dimension under each said mask element, said lateral dimension sufficient to provide removal of substrate material beneath full widths of each mask element, to define emitter tips having apexes, said etching performed while said mask elements remain contacting said apexes; and removing said mask elements from contact with said apexes to expose said emitter tips.

17. A method according to claim 14, wherein said etching of said substrate provides a lateral etch rate of said substrate material within a factor of four of a vertical etch rate, the direction of said vertical etch rate being substantially perpendicular to that of said lateral etch rate.

* * * * *